(12) United States Patent
Humfeld et al.

(10) Patent No.: US 11,828,730 B2
(45) Date of Patent: *Nov. 28, 2023

(54) VACUUM BAG HAVING INTEGRAL ULTRASONIC TRANSDUCERS

(71) Applicant: The Boeing Company, Chicago, IL (US)

(72) Inventors: Keith Daniel Humfeld, Federal Way, WA (US); Morteza Safai, Newcastle, WA (US)

(73) Assignee: The Boeing Company, Arlington, VA (US)

( * ) Notice: Subject to any disclaimer, the term of this patent is extended or adjusted under 35 U.S.C. 154(b) by 846 days.

This patent is subject to a terminal disclaimer.

(21) Appl. No.: 15/899,337

(22) Filed: Feb. 19, 2018

(65) Prior Publication Data

US 2019/0257797 A1 Aug. 22, 2019

(51) Int. Cl.

| G01N 29/24 | (2006.01) |
|---|---|
| B29C 70/44 | (2006.01) |
| B81C 3/00 | (2006.01) |
| G01N 29/04 | (2006.01) |
| B64F 5/60 | (2017.01) |
| B29C 43/36 | (2006.01) |
| B64F 5/10 | (2017.01) |

(52) U.S. Cl.
CPC ....... *G01N 29/2475* (2013.01); *B29C 70/443* (2013.01); *B81C 3/001* (2013.01); *G01N 29/043* (2013.01); *B29C 2043/3644* (2013.01); *B64F 5/10* (2017.01); *B64F 5/60* (2017.01); *G01N 2291/106* (2013.01)

(58) Field of Classification Search
CPC ............. G01N 29/2475; G01N 29/227; B29C 43/3642; B29C 2043/3644
USPC ........................................................ 156/242
See application file for complete search history.

(56) References Cited

U.S. PATENT DOCUMENTS

| 5,844,349 A | 12/1998 | Oakley et al. | |
|---|---|---|---|
| 8,196,452 B2* | 6/2012 | Nelson | B29C 70/443 |
| | | | 73/37 |
| 2007/0013269 A1* | 1/2007 | Huang | B06B 1/0292 |
| | | | 310/334 |

(Continued)

OTHER PUBLICATIONS

Zhao, "Fabrication and characterization of aerosol-jet printed strain sensors for multifunctional composite structures" Smart Mater. Struct. 21 (2012) 115008 (Year: 2012).*

(Continued)

*Primary Examiner* — Matthew J Daniels
*Assistant Examiner* — Hana C Page
(74) *Attorney, Agent, or Firm* — Yee & Associates, P.C.

(57) ABSTRACT

Systems and methods are provided for enhanced vacuum bags. One embodiment is a method that includes placing a laminate comprising uncured fiber reinforced polymer onto a mandrel, laying up a vacuum bag, which includes integral ultrasonic transducers within a gas-impermeable layer, atop the laminate, and sealing the vacuum bag to the mandrel. The method also includes drawing a vacuum on the laminate via the vacuum bag, removing gas between the integral ultrasonic transducers and the laminate, and interrogating the laminate with the integral ultrasonic transducers.

21 Claims, 8 Drawing Sheets

(56) References Cited

U.S. PATENT DOCUMENTS

| | | | | |
|---|---|---|---|---|
| 2007/0017297 A1* | 1/2007 | Georgeson | ............ | G01N 29/069 73/801 |
| 2008/0210372 A1* | 9/2008 | Cumings | ................. | B29C 70/44 156/286 |
| 2008/0211130 A1* | 9/2008 | Rydin | ..................... | B29C 70/44 264/102 |
| 2008/0223152 A1* | 9/2008 | Georgeson | .......... | G01M 5/0016 73/862.041 |
| 2009/0133501 A1* | 5/2009 | Georgeson | ............ | G01N 29/221 73/632 |
| 2014/0360289 A1* | 12/2014 | Georgeson | ............. | G01D 11/30 73/866.5 |
| 2015/0024160 A1* | 1/2015 | Georgeson | ............. | B29C 65/48 428/60 |
| 2015/0367586 A1* | 12/2015 | Georgeson | ............ | B06B 1/0688 367/140 |
| 2016/0121560 A1* | 5/2016 | Lee | ....................... | B29C 70/446 264/511 |
| 2017/0307568 A1 | 10/2017 | Humfeld et al. | | |

OTHER PUBLICATIONS

Ozaydin-Ince ("CVD of polymeric thin films: applications in sensors, biotechnology, microelectronics/ organic electronics, microfluidics, MEMS, composites, and membranes," Rep. Prog. Phys. 75 (2012) 016501). (Year: 2012).*

Zang ("Graphene and carbon nanotubes (CNT) in MEMS/NEWMS applications", Microelectronic Engineering 132 (2015) 192-206). (Year: 2015).*

\* cited by examiner

VACUUM BAG HAVING INTEGRAL ULTRASONIC TRANSDUCERS

FIELD

The disclosure relates to the field of composite parts, and in particular, to imaging composite parts.

BACKGROUND

During curing, inconsistencies such as small bubbles may form within a laminate as it transitions into a composite part. A technician may therefore image the resulting composite part in order to ensure that no inconsistencies are larger than a predetermined threshold size (e.g., area or length). Because composite parts may be opaque to visible light, the composite part may be inspected via ultrasound. However, the ultrasonic inspection process for a composite part takes a great deal of time as the ultrasound inspection system is placed, operated, and repositioned multiple times. This is especially true for large composite parts, such as wing panels of an aircraft. Hence, the time to fabricate and also ensure the quality of a composite part is undesirably long. Therefore, it would be desirable to have a method and apparatus that take into account at least some of the issues discussed above, as well as other possible issues.

SUMMARY

Embodiments described herein provide ultrasonic inspection systems which are integrated into a vacuum bag that is utilized during curing of a laminate. In this manner, the formation of inconsistencies at the laminate may be quantified in real-time during curing. This means that processes for inspecting a composite part do not add additional time to the production process. Furthermore, because ultrasonic transducers are included within the vacuum bag itself, there is no additional labor involved in setting up, operating, and tearing down an imaging system for the composite part. The act of preparing a laminate for curing into the composite part necessarily also prepares the laminate for ultrasonic inspection during curing.

One embodiment is a method that includes placing a laminate comprising uncured fiber reinforced polymer onto a mandrel, laying up a vacuum bag, which includes integral ultrasonic transducers within a gas-impermeable layer, atop the laminate, and sealing the vacuum bag to the mandrel. The method also includes drawing a vacuum on the laminate via the vacuum bag, removing gas between the integral ultrasonic transducers and the laminate, and interrogating the laminate with the integral ultrasonic transducers.

Another embodiment is a non-transitory computer readable medium embodying programmed instructions which, when executed by a processor, are operable for performing a method. The method includes placing a laminate comprising uncured fiber reinforced polymer onto a mandrel, laying up a vacuum bag, which includes integral ultrasonic transducers within a gas-impermeable layer, atop the laminate, and sealing the vacuum bag to the mandrel. The method also includes drawing a vacuum on the laminate via the vacuum bag, removing gas between the integral ultrasonic transducers and the laminate, and interrogating the laminate with the integral ultrasonic transducers.

A further embodiment is an apparatus that includes a vacuum bag for curing a composite part. The vacuum bag includes a layer of pliable, gas-impermeable material that includes integral ultrasonic transducers and is transparent to ultrasound, connectors at the layer that electronically couple the ultrasonic transducers and are disposed within the layer, an interface at the layer that enables control of the integral ultrasonic transducers via the connectors, and a vacuum port that penetrates the layer and provides a passage for gas to travel through the layer.

A further embodiment is a system that includes a mandrel defining a surface for receiving a laminate, a laminate comprising fibers and resin that is laid-up atop the surface, and a vacuum bag for curing the laminate into a composite part that is sealed to the mandrel. The vacuum bag includes a layer of pliable, gas-impermeable material that includes integral ultrasonic transducers and is transparent to ultrasound, connectors at the layer that electronically couple the ultrasonic transducers and are disposed within the layer, and an interface at the layer that enables control of the integral ultrasonic transducers via the connectors.

A further embodiment is a method. The method includes fabricating a vacuum bag for curing a composite part, by acquiring a layer of pliable, gas-impermeable material that is transparent to ultrasound, etching into the layer at locations for an array of ultrasonic transducers, dispensing the array of ultrasonic transducers at the locations, and inserting a vacuum port through the layer that enables gas to be transported across the layer.

Other illustrative embodiments (e.g., methods and computer-readable media relating to the foregoing embodiments) may be described below. The features, functions, and advantages that have been discussed can be achieved independently in various embodiments or may be combined in yet other embodiments further details of which can be seen with reference to the following description and drawings.

DESCRIPTION OF THE DRAWINGS

Some embodiments of the present disclosure are now described, by way of example only, and with reference to the accompanying drawings. The same reference number represents the same element or the same type of element on all drawings.

DESCRIPTION

The figures and the following description illustrate specific illustrative embodiments of the disclosure. It will thus be appreciated that those skilled in the art will be able to devise various arrangements that, although not explicitly described or shown herein, embody the principles of the disclosure and are included within the scope of the disclosure. Furthermore, any examples described herein are intended to aid in understanding the principles of the disclosure, and are to be construed as being without limitation to such specifically recited examples and conditions. As a result, the disclosure is not limited to the specific embodiments or examples described below, but by the claims and their equivalents.

Figure 1:
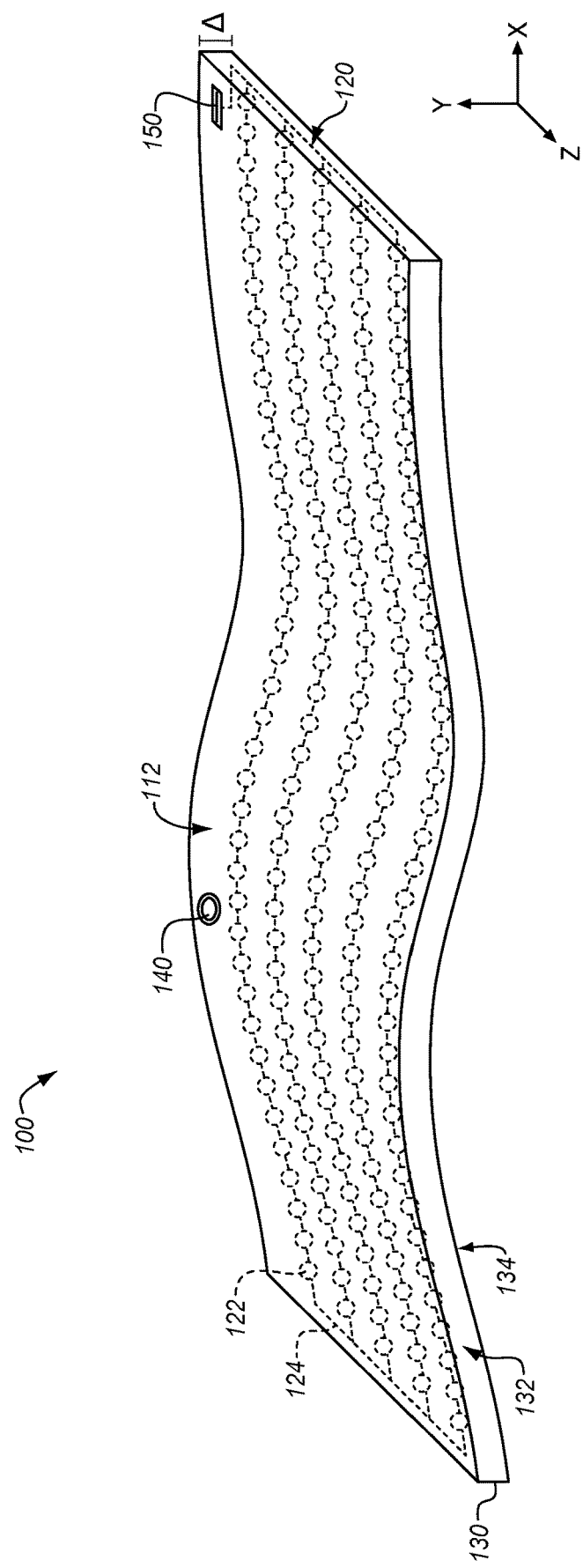
FIG. 1 is a perspective view of a vacuum bag that includes integral ultrasonic transducers in an illustrative embodiment.

FIG. 1 is a perspective view of a vacuum bag 100 that includes an array 120 (e.g., a phased array) of ultrasonic transducers 122 that are electronically coupled via connectors 124 in an illustrative embodiment. In this embodiment, vacuum bag 100 comprises any suitable type of material 132 that is both pliable and gas-impermeable. For example, vacuum bag 100 may comprise a layer 130 of material 132 that is one to three millimeters thick, droops under its own weight, and resists deformation in the heat and/or pressure of an autoclave (e.g., 230° C.). In this embodiment, vacuum bag 100 further comprises a polytetrafluoroetheylene (PTFE) coating 134.

Vacuum port 140 penetrates through layer 130 and provides a passage for gas to pass across vacuum bag 100. When placed over a laminate and sealed around its perimeter (e.g., onto a mandrel), a vacuum may be drawn on vacuum bag 100 via vacuum port 140, securing both vacuum bag 100 and the laminate to the mandrel. Drawing a vacuum helps to conform vacuum bag 100 to laminate 240. Further details of the operation of vacuum bag 100 are provided with regard to FIGS. 2-3.

Array 120 of ultrasonic transducers 122 may be operated to image the laminate while the laminate is being cured into a composite part. Ultrasonic transducers 122 are integral with (e.g., directly in contact with, or within) layer 130. In this embodiment, array 120 is located a distance Δ below surface 112 of layer 130. In order to ensure that ultrasonic transducers 122 are sufficiently small to fit within layer 130 (which may be on the order of millimeters of thickness), ultrasonic transducers 122 may comprise Micro-Electro-Mechanical Systems (MEMS) transducers. Connectors 124 provide electronic connections between ultrasonic transducers 122 (i.e., connectors 124 electronically couple the ultrasonic transducers 122). For example, connectors 124 may provide electrical power, communication channels for exchanging data, and/or other features that facilitate control of array 120 via an interface 150.

Interface 150 enables electronic control of ultrasonic transducers 122 via connectors 124. For example, interface 150 may facilitate generating, receiving, and quantifying pulses of ultrasonic energy at ultrasonic transducers 122. Interface 150 may comprise a wired interface (e.g., as shown) such as a Universal Serial Bus (USB) interface, Ethernet port, etc., or may even comprise a wireless interface, such as a transceiver that operates in accordance with Institute of Electrical and Electronics Engineers (IEEE) 802.11 standards. In embodiments where interface 150 comprises a wireless interface, interface 150 need not be exposed at a surface (e.g., surface 112) of vacuum bag 100, and may even be entirely internal to layer 130.

Figure 2:
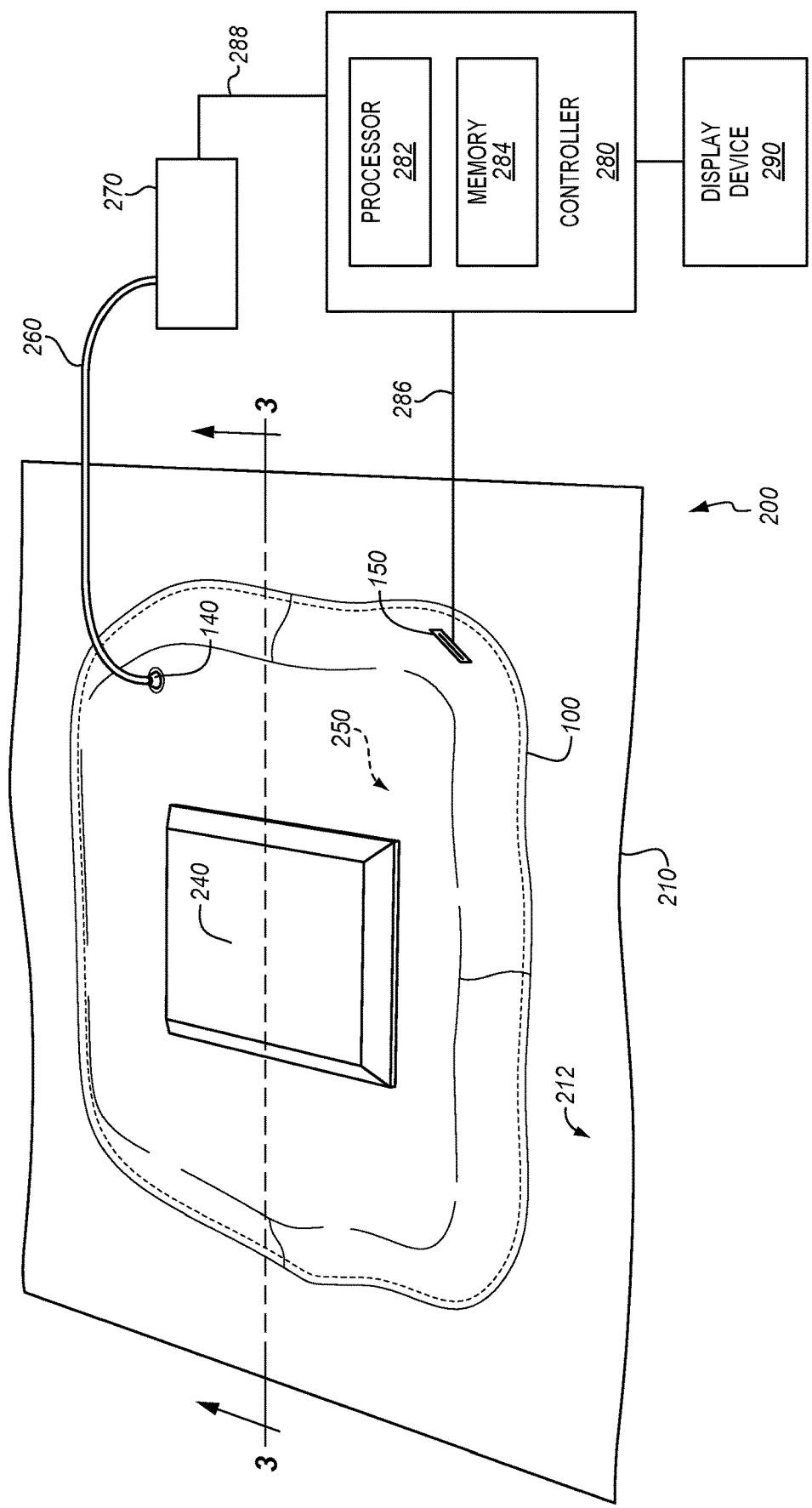
FIG. 2 is a perspective view of a vacuum bag covering a laminate that will be cured into a composite part in an illustrative embodiment.

FIG. 2 is a perspective view of a vacuum bag 100 covering a laminate 240 that will be cured into a composite part in an illustrative embodiment. In this embodiment, laminate 240 comprises multiple plies of uncured continuous Carbon Fiber Reinforced Polymer (CFRP) that have been laid-up onto surface 212 of mandrel 210. Mandrel 210 may comprise, for example, Invar tooling. Vacuum bag 100 covers the laminate 240, and is sealed onto mandrel 210, forming an airtight pocket 250. Thus, when pump 270 draws a vacuum via pressure line 260 and vacuum port 140, vacuum bag 100 is pressed against laminate 240.

Controller 280 manages operations pertaining to imaging the laminate 240 via vacuum bag 100. In this embodiment, controller 280 utilizes communication line 286 (e.g., a USB cable) to provide power and to operate ultrasonic transducers 122 via interface 150. Controller 280 also utilizes communication line 288 to control the operations of pump 270. Controller 280 may format results from ultrasonic transducers 122 in order to provide two-dimensional and/or three dimensional images (e.g., depth maps) for review via display device 290. Controller 280 may be implemented, for example, as custom circuitry, as a hardware processor executing programmed instructions, or some combination thereof. In this embodiment, controller 280 is implemented as a processor 282 that accesses memory 284 (e.g., Random Access Memory (RAM)). In further embodiments, vacuum bag 100 may be inductively powered or battery powered, eliminating the need for communication line 286 and enabling vacuum bag 100 to be operated entirely wirelessly.

Figure 3:
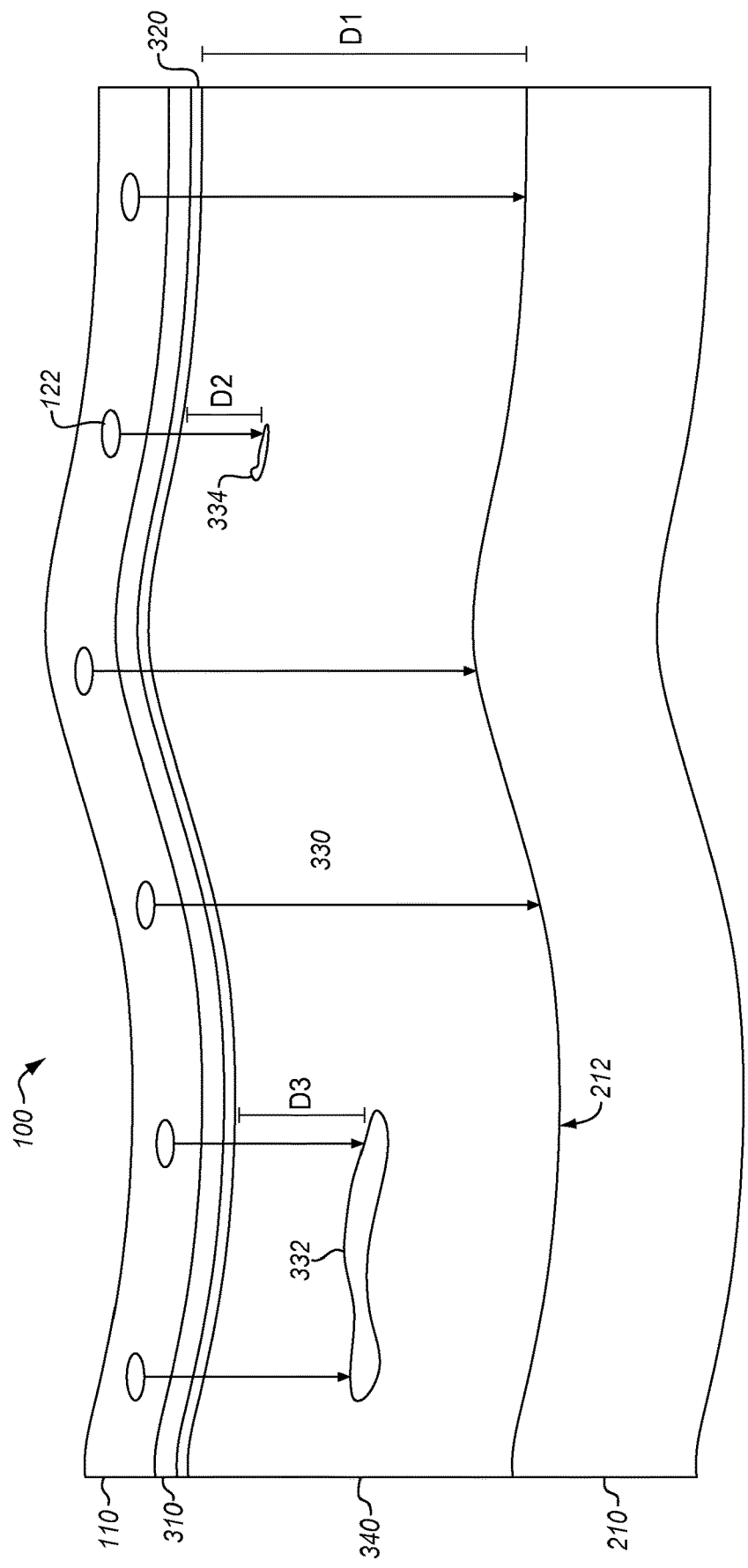
FIG. 3 is a side view of a vacuum bag that is utilizing integral ultrasonic transducers to image a composite part in an illustrative embodiment.

FIG. 3 is a side view of a vacuum bag that is utilizing integral ultrasonic transducers to image a composite part 340 in an illustrative embodiment. Specifically, FIG. 3 corresponds with view arrows 3 of FIG. 2, after laminate 240 has been cured into composite part 340. As shown in FIG. 3, composite part 340 includes inconsistency 332 and inconsistency 334, which result from air pockets, delaminations between plies, etc. In order to image the composite part 340 for inconsistencies, ultrasonic transducers 122 emit ultrasonic waves 330 beneath them and take measurements via post-echo imaging techniques. That is, each ultrasonic transducer 122 uses an ultrasonic wave 330 to measure/quantify depths of inconsistencies. Depth may be measured perpendicular to the surface 342 of composite part 340 at the location of each transducer. In this manner, the array 120 generates a depth map, wherein each ultrasonic transducer provides a pixel value for depth at a different surface location for composite part 340. A layer 110 corresponding with layer 130 of FIG. 1 is also illustrated.

Ultrasonic waves 330 travel through breather material 310 and a layer of Fluorinated Ethylene Propylene (e.g., FEP 320) into composite part 340. FEP may be used to prevent a breather material from getting saturated by resin (e.g., when it is at low viscosity during cure prior to gelation) and becoming integral to the part. In contrast to FEP, a peel ply is a layer of prepreg built integral to the part, that is designed to be torn (peeled) away part way through its thickness, making a rough surface for subsequent bonding. In cases where a peel ply is included, it may be considered part of the laminate, and a layer of FEP may be placed between the laminate and the breather material. Ultrasonic waves 330 travel until they reach a location where the stiffness of the material they are traveling through substantially changes, such as at surface 212 of mandrel 210, or at an inconsistency 332. At such time, ultrasonic waves 330 reflect and return to ultrasonic transducers 122. Based on the timing at which an ultrasonic wave 330 returns, an ultrasonic transducer 122 may determine the depth to which the ultrasonic wave 330 traveled. Thus, the existence of an inconsistency 332 or an inconsistency 334 may be determined in circumstances where an ultrasonic wave 330 returns more quickly than expected.

In FIG. 3, ultrasonic waves 330 that travel entirely through composite part 340 travel a depth D1, ultrasonic waves 330 which encounter the inconsistency 334 travel a depth D2, and ultrasonic waves 330 which encounter the inconsistency 332 travel a depth D3. When depths are determined for ultrasonic waves 330 across an array of ultrasonic transducers 122, the locations and sizes of individual defects across the entirety of composite part 340 may be accurately mapped.

Illustrative details of the operation of vacuum bag 100 will be discussed with regard to FIG. 4. Assume, for this embodiment, that a technician wishes to lay up a laminate, cure the laminate into a composite part, and image the laminate during curing to quantify the locations and sizes of inconsistencies within the laminate.

Figure 4:
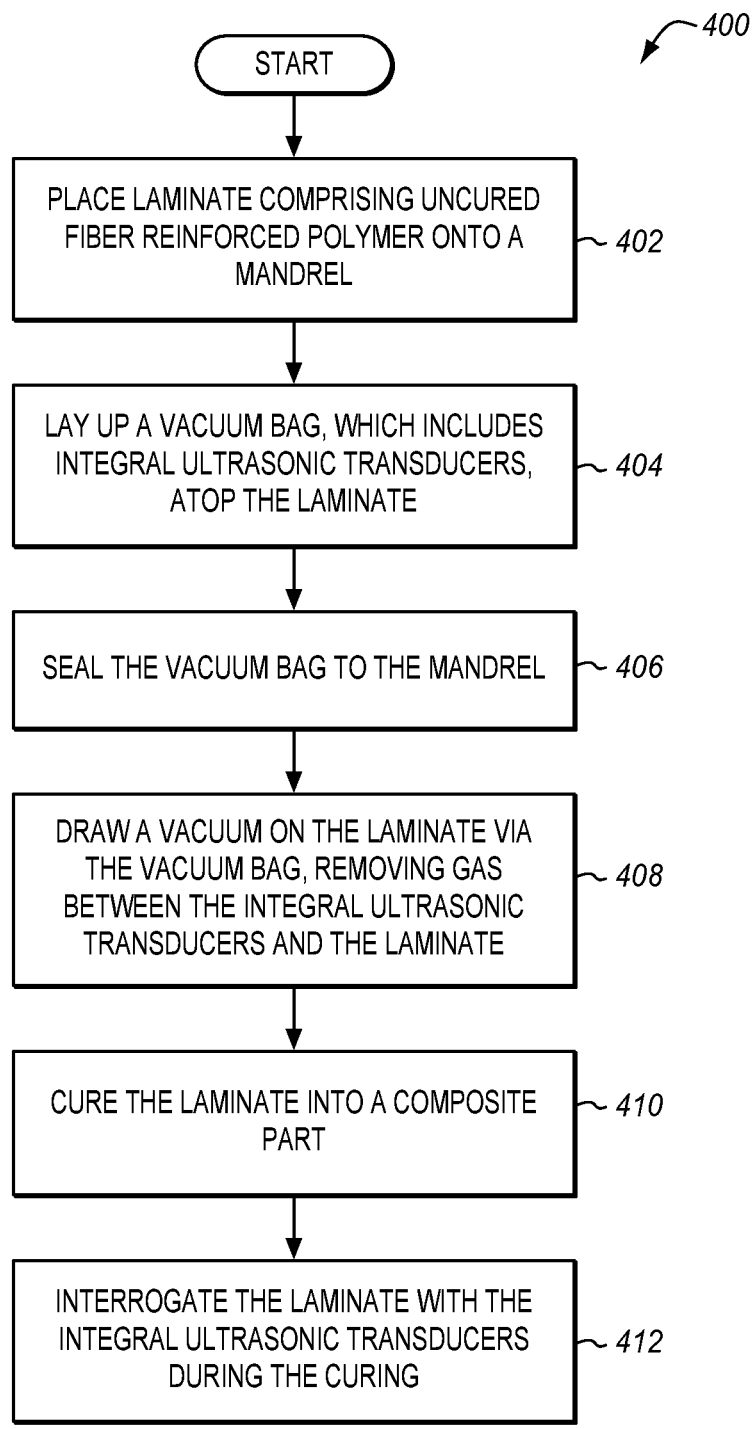
FIG. 4 is a flowchart illustrating a method for imaging a laminate while the laminate is being cured into a composite part in an illustrative embodiment.

FIG. 4 is a flowchart illustrating a method 400 for imaging a laminate while the laminate is being cured into a composite part in an illustrative embodiment. The steps of method 400 are described with reference to vacuum bag 100 of FIG. 1, but those skilled in the art will appreciate that method 400 may be performed with other vacuum bags that include ultrasonic transducers integrated within them. The steps of the flowcharts described herein are not all inclusive and may include other steps not shown. The steps described herein may also be performed in an alternative order.

Laminate 240, which includes uncured fiber reinforced polymer, is placed (e.g., laid-up) onto mandrel 210 (step 402). For example, laminate 240 may be laid-up by an Automated Fiber Placement (AFP) machine in accordance with a Numerical Control (NC) program. A layer of FEP 320 may be placed directly atop laminate 240 after layup has been completed, and a breather material 310 may be placed directly atop FEP 320.

Vacuum bag 100 is laid up atop laminate 240 (e.g., directly atop breather material 310), and vacuum bag 100 includes ultrasonic transducers 122 which are integral with vacuum bag 100 (step 404). Vacuum bag 100 is sealed onto mandrel 210 via tape or an adhesive, forming airtight pocket 250 between vacuum bag 100 and mandrel 210 (step 406). For example, boundaries of vacuum bag 100 may be taped in place onto mandrel 210 in order to form airtight pocket 250. With airtight pocket 250 formed, controller 280 instructs pump 270 to draw a vacuum on laminate 240 via vacuum bag 100 (specifically, vacuum port 140 of vacuum bag 100) (step 408). This process evacuates gas from airtight pocket 250, which removes gas located between ultrasonic transducers 122 and laminate 240, pressing ultrasonic transducers 122 against laminate 240. This allows ultrasonic transducers 122 to conform with any desired surface curvature at laminate 240.

With vacuum bag 100 fully compressed against laminate 240 (i.e., via breather material 310 and FEP 320), curing may proceed. Thus, the entirety of mandrel 210, laminate 240, and vacuum bag 100 may be moved to an autoclave for curing (e.g., at hundreds of degrees Celsius). Laminate 240 is cured into a composite part 340 (e.g., via the application of heat and pressure) (step 410).

During curing, controller 280 interrogates laminate 240 with ultrasonic waves 330 from ultrasonic transducers 122 (step 412). For example, controller 280 may direct ultrasonic transducers 122 to induce ultrasonic waves 330 which travel through laminate 240, and may further direct ultrasonic transducers 122 to record a time taken for these ultrasonic waves 330 to return. This data is acquired by controller 280, which determines depth values for each ultrasonic transducer 122 and uses those depth values to generate images of laminate 240. For example, controller 280 may generate a new image (e.g., depth map) of laminate 240 every five seconds, every five minutes, etc. during the curing process.

Based on this data, controller 280 may further identify inconsistencies that are larger than a threshold size, and generate an instruction to update display device 290 with a report that describes the inconsistencies that are larger than the threshold size. In further embodiments, this type of interrogation could be used prior to curing to inspect the impregnated preform to determine if more consolidation is needed prior to curing to remove out of tolerance inconsistencies. This type of inspection could even be used to aid in debalking the preform. In still further embodiments, controller 280 selectively scraps the laminate 240 prior to curing if interrogating the laminate 240 prior to curing identifies inconsistencies larger than a threshold size.

Utilizing method 400, imaging processes may be integrated with curing processes for composite parts. That is, vacuum bag 100 enables imaging to be performed as part of the curing process. This eliminates the need for separate set up and tear-down of imaging systems, and enables hours of curing time to be used actively imaging a laminate as the laminate transitions into a composite part. Hence, substantial time and labor savings are achieved. Furthermore, changing characteristics of laminate 240 may be measured during the cure process in real-time. This enables controller 280 to engage in in-process control of the curing process, such as by varying cure temperature applied by an autoclave, cure pressure, and/or other variables. Such in-process control may help to prevent inconsistencies from growing larger than desired, and may even help to facilitate active processes that reduce the size of inconsistencies.

Figure 5:
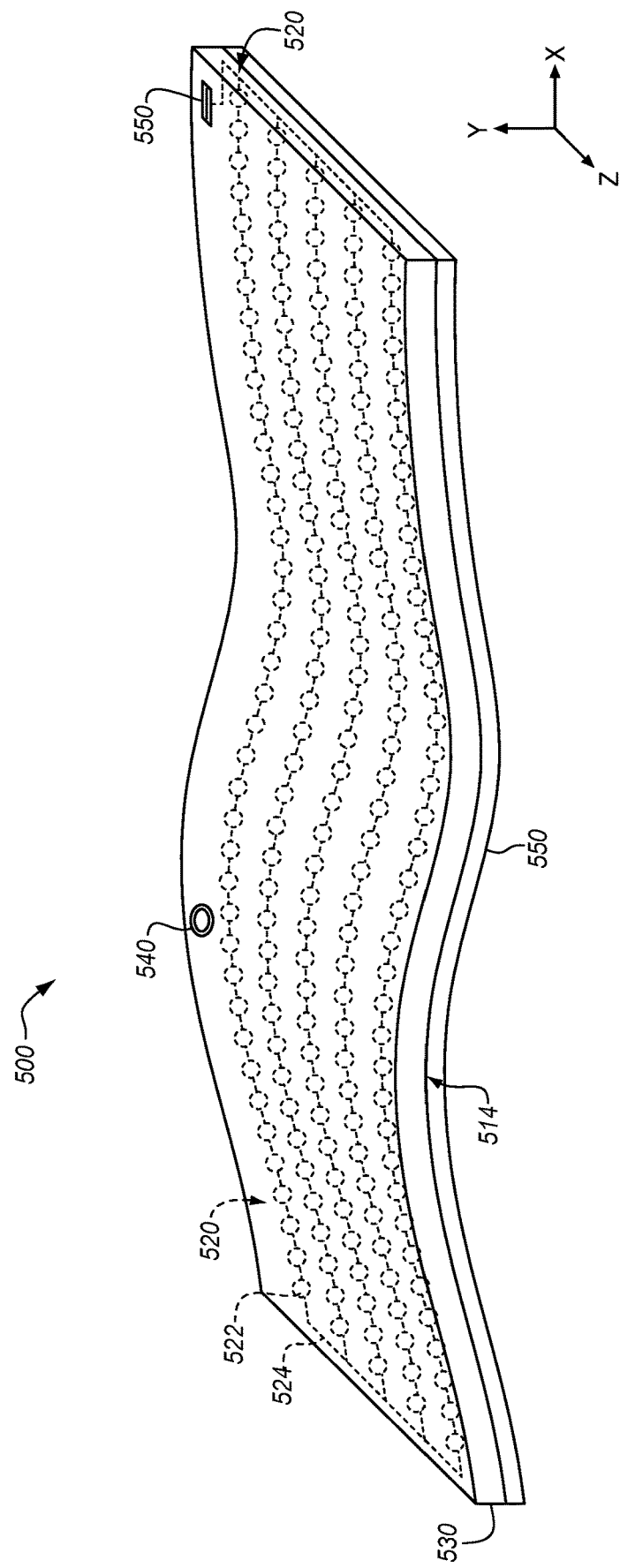
FIG. 5 is a perspective view of a vacuum bag that includes an integrated breather material in an illustrative embodiment.

In further embodiments, a vacuum bag may include integrated breather materials (e.g., cloth or open-celled material that enables gas to exit the laminate 240 and travel towards vacuum port 140). FIG. 5 is a perspective view of a vacuum bag 500 that includes an integrated breather material 550 in an illustrative embodiment. Specifically, breather material 550 is adhered to surface 514 of layer 530. An array 520 of transducers 522 is integral with layer 530, and includes both transducers 522 and connectors 524. Vacuum bag 500 also includes interface 580 and vacuum port 540. For embodiments that utilize thermoset resins prior to consolidation, the existence of liquid resin in contact with the vacuum bag facilitates the ultrasonic inspection process, because the liquid resin will conduct ultrasonic energy. In further embodiments, vacuum bag 500 may include an integrated breather material above array 520, and perforations at array 520 enable gas to pass into the integrated breather material.

Figure 6:
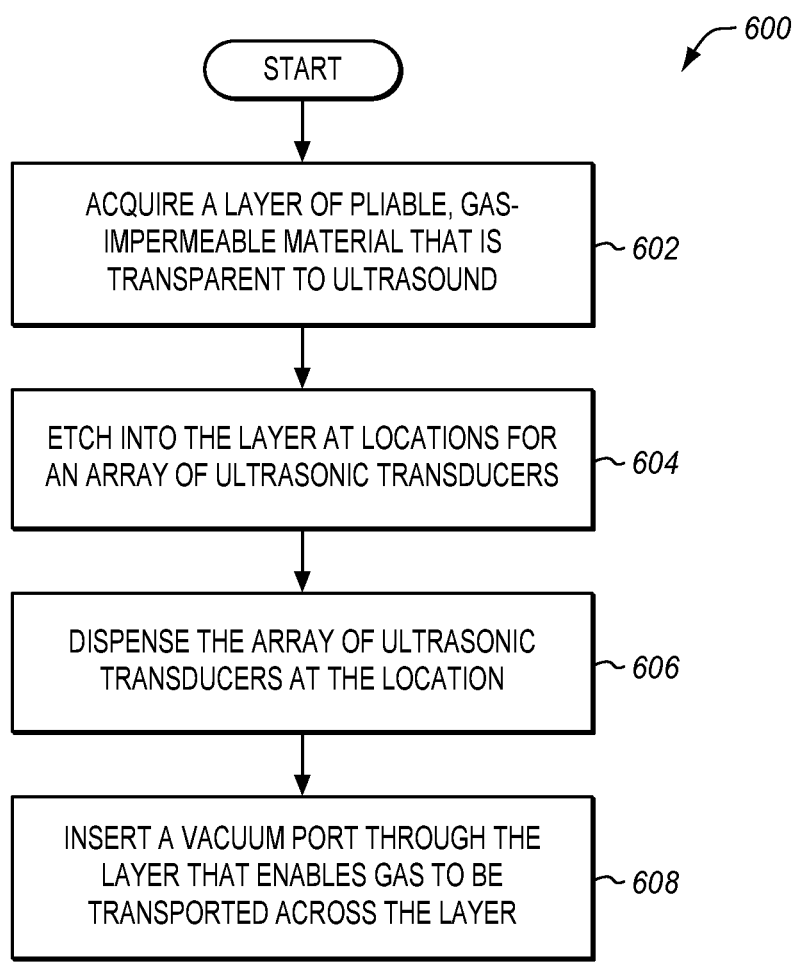
FIG. 6 is a flowchart illustrating a method for fabricating a vacuum bag that includes integral ultrasonic transducers in an illustrative embodiment.

FIG. 6 is a flowchart illustrating a method 600 for fabricating a vacuum bag that includes integral ultrasonic transducers in an illustrative embodiment. Method 600 may be used, for example, to fabricate a vacuum bag 100 that includes array 120 of ultrasonic transducers 122. Method 600 includes acquiring a layer 130 of pliable, gas-impermeable material that is transparent to ultrasound (step 602). For example, the material may comprise a rubber or rubberized material (e.g., an elastomeric material). Suitable machinery then etches into the layer 130 at locations for an array of ultrasonic transducers (step 604). This may be performed as a lithographic masking process. The etching may have less than a millimeter of depth, and may even be just a few micrometers deep. An array 120 of ultrasonic transducers 122 is dispensed at the locations (step 606). This may be performed via gas deposition or other techniques for generating MEMS or printed circuits. An interface may also be added and electronically integrated with array 120.

Machinery may insert a vacuum port 140 through layer 130. Vacuum port 140 which enables gas to be transported across layer 130 (step 608). For example, a portion of the layer 130 that does not include ultrasonic transducers 122 or connectors 124 may be cut out and replaced with a port.

Further details and exemplary techniques for utilizing and/or fabricating arrays of ultrasonic transducers are described for example, in U.S. patent application Ser. No. 15/135,210, entitled "MEMS TRANSDUCERS IN A PHASED ARRAY COUPLED TO A FLEXIBLE SUBSTRATE USING CARBON NANOTUBES FOR CONFORMAL ULTRASOUND SCANNING," filed on Apr. 21, 2016 (published as 20170307568 on Oct. 26, 2017), issued as U.S. Pat. No. 10,006,888 on Jun. 26, 2018 and herein incorporated by reference.

EXAMPLES

In the following examples, additional processes, systems, and methods are described in the context of utilizing enhanced vacuum bags to image laminates while those laminates are being cured.

Figure 7:
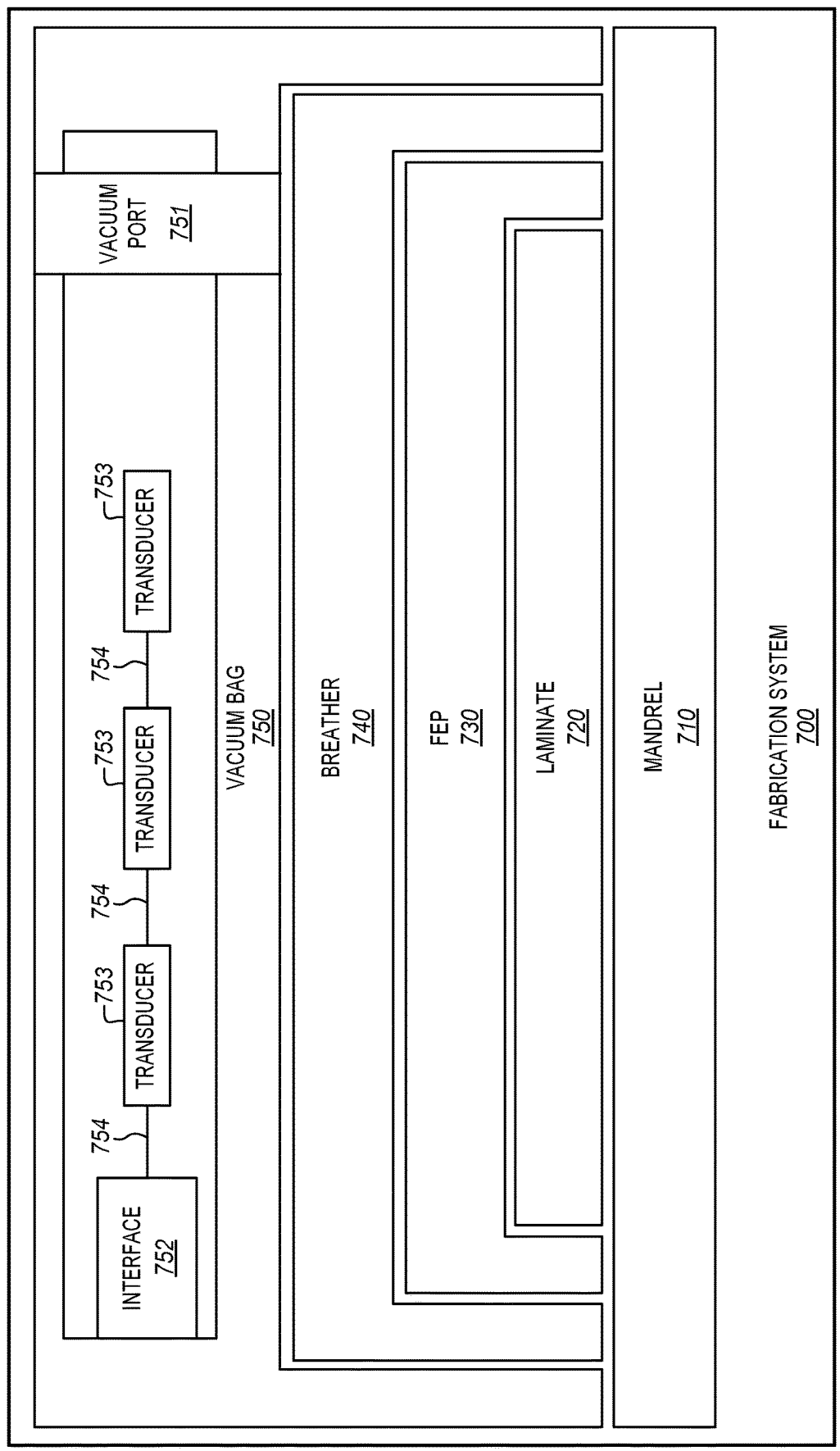
FIG. 7 is a block diagram of a fabrication system for composite parts in an illustrative embodiment.

FIG. 7 is a block diagram of a fabrication system 700 for composite parts in an illustrative embodiment. According to FIG. 7, fabrication system 700 includes mandrel 710. Laminate 720 is laid-up onto mandrel 710, and is covered by FEP 730. FEP 730 is itself covered by breather 740, and vacuum bag 750. Vacuum bag 750 is sealed to mandrel 710, ensuring that any space between vacuum bag 750 and laminate 720 is airtight. In this example, vacuum bag 750 includes vacuum port 751, which enables gas to be removed from between vacuum bag 750 and mandrel 710 (including, for example, any gas trapped between vacuum bag 750 and laminate 720). Vacuum bag 750 further includes ultrasonic transducers 753, which are coupled with each other and interface 752 via connectors 754

Figure 8:
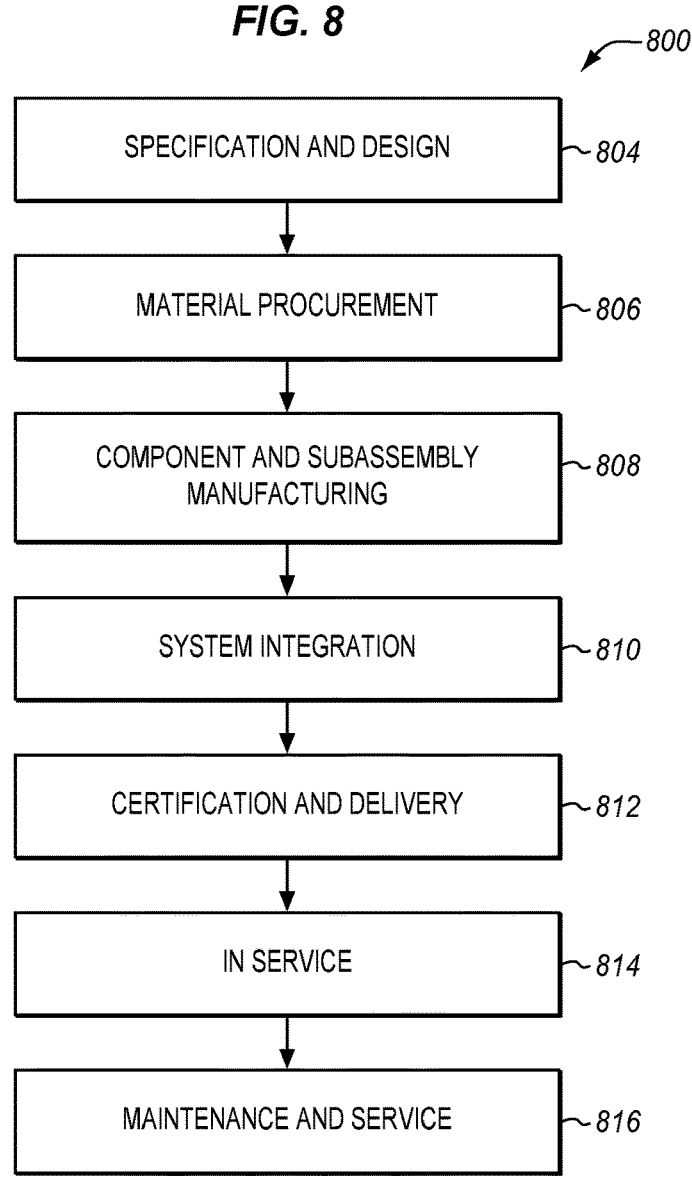
FIG. 8 is a flow diagram of aircraft production and service methodology in an illustrative embodiment.
Figure 9:
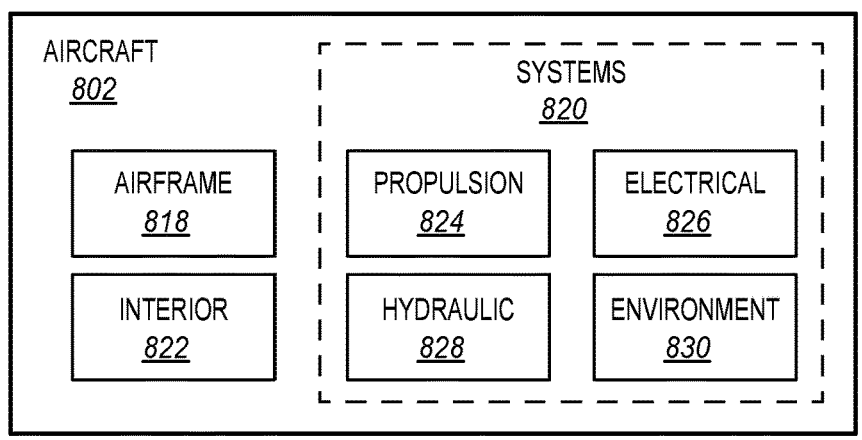
FIG. 9 is a block diagram of an aircraft in an illustrative embodiment.

Referring more particularly to the drawings, embodiments of the disclosure may be described in the context of an aircraft manufacturing and service method 800 as shown in FIG. 8 and an aircraft 802 as shown in FIG. 9. During pre-production, illustrative method 800 may include specification and design 804 of the aircraft 802 and material procurement 806. During production, component and subassembly manufacturing 808 and system integration 810 of the aircraft 802 takes place. Thereafter, the aircraft 802 may go through certification and delivery 812 in order to be placed in service 814. While in service by a customer, the aircraft 802 is scheduled for routine maintenance and service 816 (which may also include modification, reconfiguration, refurbishment, and so on). Apparatus and methods embodied herein may be employed during any one or more suitable stages of the production and service method 800 (e.g., specification and design 804, material procurement 806, component and subassembly manufacturing 808, system integration 810, certification and delivery 812, service 814, maintenance and service 816) and/or any suitable component of aircraft 802 (e.g., airframe 818, systems 820, interior 822, propulsion 824, electrical 826, hydraulic 828, environmental 830).

Each of the processes of method 800 may be performed or carried out by a system integrator, a third party, and/or an operator (e.g., a customer). For the purposes of this description, a system integrator may include without limitation any number of aircraft manufacturers and major-system subcontractors; a third party may include without limitation any number of vendors, subcontractors, and suppliers; and an operator may be an airline, leasing company, military entity, service organization, and so on.

As shown in FIG. 9, the aircraft 802 produced by illustrative method 800 may include an airframe 818 with a plurality of systems 820 and an interior 822. Examples of high-level systems 820 include one or more of a propulsion system 824, an electrical system 826, a hydraulic system 828, and an environmental system 830. Any number of other systems may be included. Although an aerospace example is shown, the principles of the invention may be applied to other industries, such as the automotive industry.

As already mentioned above, apparatus and methods embodied herein may be employed during any one or more of the stages of the production and service method 800. For example, components or subassemblies corresponding to production stage 808 may be fabricated or manufactured in a manner similar to components or subassemblies produced while the aircraft 802 is in service. Also, one or more apparatus embodiments, method embodiments, or a combination thereof may be utilized during the production stages 808 and 810, for example, by substantially expediting assembly of or reducing the cost of an aircraft 802. Similarly, one or more of apparatus embodiments, method embodiments, or a combination thereof may be utilized while the aircraft 802 is in service, for example and without limitation, to maintenance and service 816. For example, the techniques and systems described herein may be used for steps 806, 808, 810, 814, and/or 816, and/or may be used for airframe 818 and/or interior 822. These techniques and systems may even be utilized for systems 820, including for example propulsion 824, electrical 826, hydraulic 828, and/or environmental 830.

In one embodiment, a part comprises a portion of airframe 818, and is manufactured during component and subassembly manufacturing 808. The part may then be assembled into an aircraft in system integration 810, and then be utilized in service 814 until wear renders the part unusable. Then, in maintenance and service 816, the part may be discarded and replaced with a newly manufactured part. Inventive components and methods may be utilized throughout component and subassembly manufacturing 808 in order to inspect and manufacture new parts.

Any of the various control elements (e.g., electrical or electronic components) shown in the figures or described herein may be implemented as hardware, a processor implementing software, a processor implementing firmware, or some combination of these. For example, an element may be implemented as dedicated hardware. Dedicated hardware elements may be referred to as "processors", "controllers", or some similar terminology. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, a network processor, application specific integrated circuit (ASIC) or other circuitry, field programmable gate array (FPGA), read only memory (ROM) for storing software, random access memory (RAM), non-volatile storage, logic, or some other physical hardware component or module.

Also, a control element may be implemented as instructions executable by a processor or a computer to perform the functions of the element. Some examples of instructions are software, program code, and firmware. The instructions are operational when executed by the processor to direct the processor to perform the functions of the element. The instructions may be stored on storage devices that are readable by the processor. Some examples of the storage devices are digital or solid-state memories, magnetic storage media such as a magnetic disks and magnetic tapes, hard drives, or optically readable digital data storage media.

Although specific embodiments are described herein, the scope of the disclosure is not limited to those specific embodiments. The scope of the disclosure is defined by the following claims and any equivalents thereof.

What is claimed is:

1. A method comprising:
placing a laminate comprising uncured fiber reinforced polymer onto a mandrel;
laying up a vacuum bag, which includes integral ultrasonic transducers encapsulated within, integral with, and directly in contact with a vacuum bagging material of a gas-impermeable layer, atop the laminate;
sealing the vacuum bag to the mandrel;
drawing a vacuum on the laminate via the vacuum bag, removing gas between the integral ultrasonic transducers and the laminate; and
interrogating the laminate with the integral ultrasonic transducers,
wherein the integral ultrasonic transducers comprise Micro-Electro-Mechanical Systems (MEMS) transducers that are mechanically coupled to the gas-impermeable layer via carbon nanotubes that are grown onto the MEMS transducers.

2. The method of claim 1 further comprising:
curing the laminate into a composite part, wherein interrogating the laminate with the integral ultrasonic transducers is performed while curing the laminate into a composite part.

3. The method of claim 1 further comprising:
gas-depositing the integral ultrasonic transducers onto the vacuum bag as Micro-Electro-Mechanical Systems (MEMS) transducers.

4. The method of claim 3 further comprising:
selectively scrapping the laminate prior to curing if interrogating the laminate prior to curing identifies inconsistencies larger than a threshold size.

5. The method of claim 1 further comprising:
quantifying sizes and locations of inconsistencies within the laminate based on input from the integral ultrasonic transducers.

6. The method of claim 4 further comprising:
identifying inconsistencies that are larger than a threshold size, and
generating an instruction to update a display device with a report that describes the inconsistencies that are larger than the threshold size.

7. The method of claim 1 further comprising:
quantifying depths of inconsistencies within the laminate based on input from the integral ultrasonic transducers.

8. The method of claim 1 wherein:
the integral ultrasonic transducers are coupled via connectors within the gas-impermeable layer.

9. The method of claim 1 further comprising:
laying up a layer of Fluorinated Ethylene Propylene (FEP) directly in contact with the laminate, wherein laying up the vacuum bag comprises placing the vacuum bag directly in contact with the layer of FEP.

10. The method of claim 1 wherein:
the integral ultrasonic transducers are arranged in a phased array, and interrogating the laminate comprises operating the phased array.

11. A method comprising:
placing a laminate comprising uncured fiber reinforced polymer onto a mandrel;
providing a vacuum bag for curing the laminate comprising mechanically connecting a layer of pliable, gas-impermeable material to integral ultrasonic transducers;
laying up the vacuum bag, the integral ultrasonic transducers encapsulated within, integral with, and directly in contact with the layer of pliable, gas-impermeable material, atop the laminate;
sealing the vacuum bag to the mandrel;
drawing a vacuum on the laminate via the vacuum bag, removing gas between the integral ultrasonic transducers and the laminate;
curing the laminate; and
interrogating the laminate with the integral ultrasonic transducers;
wherein the integral ultrasonic transducers comprise Micro-Electro-Mechanical Systems (MEMS) transducers that are mechanically connected to the layer of pliable, gas-impermeable material via carbon nanotubes that are grown onto the MEMS transducers.

12. The method of claim 11 wherein the method further comprises:
curing the laminate into a composite part, wherein interrogating the laminate with the integral ultrasonic transducers is performed while curing the laminate into the composite part.

13. The method of claim 12 wherein:
the curing is performed in an autoclave.

14. The method of claim 11 wherein the method further comprises:
debalking the laminate prior to curing; and
interrogating the laminate during debalking of the laminate.

15. The method of claim 14 wherein the method further comprises:
selectively scrapping the laminate prior to curing if interrogating the laminate prior to curing identifies inconsistencies larger than a threshold size.

16. The method of claim 11 wherein the method further comprises:
quantifying sizes and locations of inconsistencies within the laminate based on input from the integral ultrasonic transducers.

17. The method of claim 11 wherein the method further comprises:
identifying inconsistencies that are larger than a threshold size, and
generating an instruction to update a display device with a report that describes the inconsistencies that are larger than the threshold size.

18. The method of claim 11 wherein the method further comprises:
quantifying depths of inconsistencies within the laminate based on input from the integral ultrasonic transducers.

19. The method of claim 11 wherein:
the integral ultrasonic transducers are arranged in a phased array, and interrogating the laminate comprises operating the phased array.

20. A method of fabricating a composite part comprising:
placing a laminate comprising uncured fiber reinforced polymer onto a mandrel;
providing a vacuum bag for curing the composite part comprising mechanically connecting a layer of pliable, gas-impermeable material to integral ultrasonic transducers;

laying up the vacuum bag, the integral ultrasonic transducers encapsulated within, integral with, and directly in contact with the layer of pliable, gas-impermeable material, atop the laminate;

sealing the vacuum bag to the mandrel;

drawing a vacuum on the laminate via the vacuum bag, removing gas between the integral ultrasonic transducers and the laminate;

curing the laminate into the composite part; and utilizing the vacuum bag comprising interrogating the composite part with the integral ultrasonic transducers;

wherein the integral ultrasonic transducers comprise Micro-Electro-Mechanical Systems (MEMS) transducers that are mechanically connected to the layer of pliable, gas-impermeable material via carbon nanotubes that are grown onto the MEMS transducers.

21. The method of claim 20 wherein:

the integral ultrasonic transducers are arranged in a phased array, and interrogating the laminate comprises operating the phased array.

* * * * *